United States Patent
Tsuchiya et al.

(10) Patent No.: US 6,723,626 B2
(45) Date of Patent: Apr. 20, 2004

(54) METHOD OF MANUFACTURING SEMICONDUCTOR DEVICE

(75) Inventors: Yasuaki Tsuchiya, Tokyo (JP); Akira Kubo, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/232,532

(22) Filed: Sep. 3, 2002

(65) Prior Publication Data

US 2003/0045090 A1 Mar. 6, 2003

(30) Foreign Application Priority Data

Sep. 4, 2001 (JP) .................................. 2001/268109

(51) Int. Cl.[7] ..................... H01L 21/44; H01L 21/4763; H01L 21/302; H01L 21/311; H01L 21/31

(52) U.S. Cl. ..................... 438/597; 438/151; 438/622; 438/637; 438/633; 438/634; 438/643; 438/645; 438/672; 438/677; 438/691; 438/692; 438/700; 438/745; 438/760; 438/906; 438/963

(58) Field of Search ................ 438/597, 622, 438/631, 633, 634, 637, 643, 645, 672, 677, 691, 692, 700, 745, 760, 906, 963, 151

(56) References Cited

U.S. PATENT DOCUMENTS 5,695,810 A * 12/1997 Dubin et al. .................. 427/96
5,968,848 A * 10/1999 Tanabe et al. ............... 438/745
6,068,879 A * 5/2000 Pasch ........................... 427/97
6,144,099 A * 11/2000 Lopatin et al. .............. 257/758
6,207,569 B1 * 3/2001 Schonauer et al. .......... 438/692
6,225,223 B1 * 5/2001 Liu et al. ..................... 438/687
6,290,865 B1 * 9/2001 Lloyd et al. ................... 216/92
6,319,833 B1 * 11/2001 Schonauer et al. .......... 438/687
6,350,687 B1 * 2/2002 Avanzino et al. ............ 438/687
6,458,674 B1 * 10/2002 Ohashi et al. ............... 438/542
2002/0170574 A1 * 11/2002 Quarantello .................. 134/6

FOREIGN PATENT DOCUMENTS

| JP | 5-315331 | 11/1993 |
|---|---|---|
| JP | 8-64594 | 3/1996 |
| JP | 8-83780 | 3/1996 |
| JP | 2000-12543 | 1/2000 |
| JP | 2000-315666 | 11/2000 |
| JP | 2001-89747 | 4/2001 |

* cited by examiner

Primary Examiner—John F. Niebling
Assistant Examiner—Stanetta Isaac
(74) Attorney, Agent, or Firm—McGinn & Gibb, PLLC

(57) ABSTRACT

In a method of manufacturing a semiconductor device, an insulating film is formed on a semiconductor substrate, and a wiring line groove is formed in the insulating film. Then, a conductive film is formed to fill the wiring line groove and to cover the insulating film. The conductive film is removed using a CMP polishing method until the insulating film is exposed, to complete a wiring line. Subsequently, a front side of the semiconductor substrate is rinsed on which the wiring line is formed, and then a back side of the semiconductor substrate is rinsed while supplying to the front side of the semiconductor substrate, a protection solution for forming a protection film in an exposed surface of the wiring line.

23 Claims, 8 Drawing Sheets

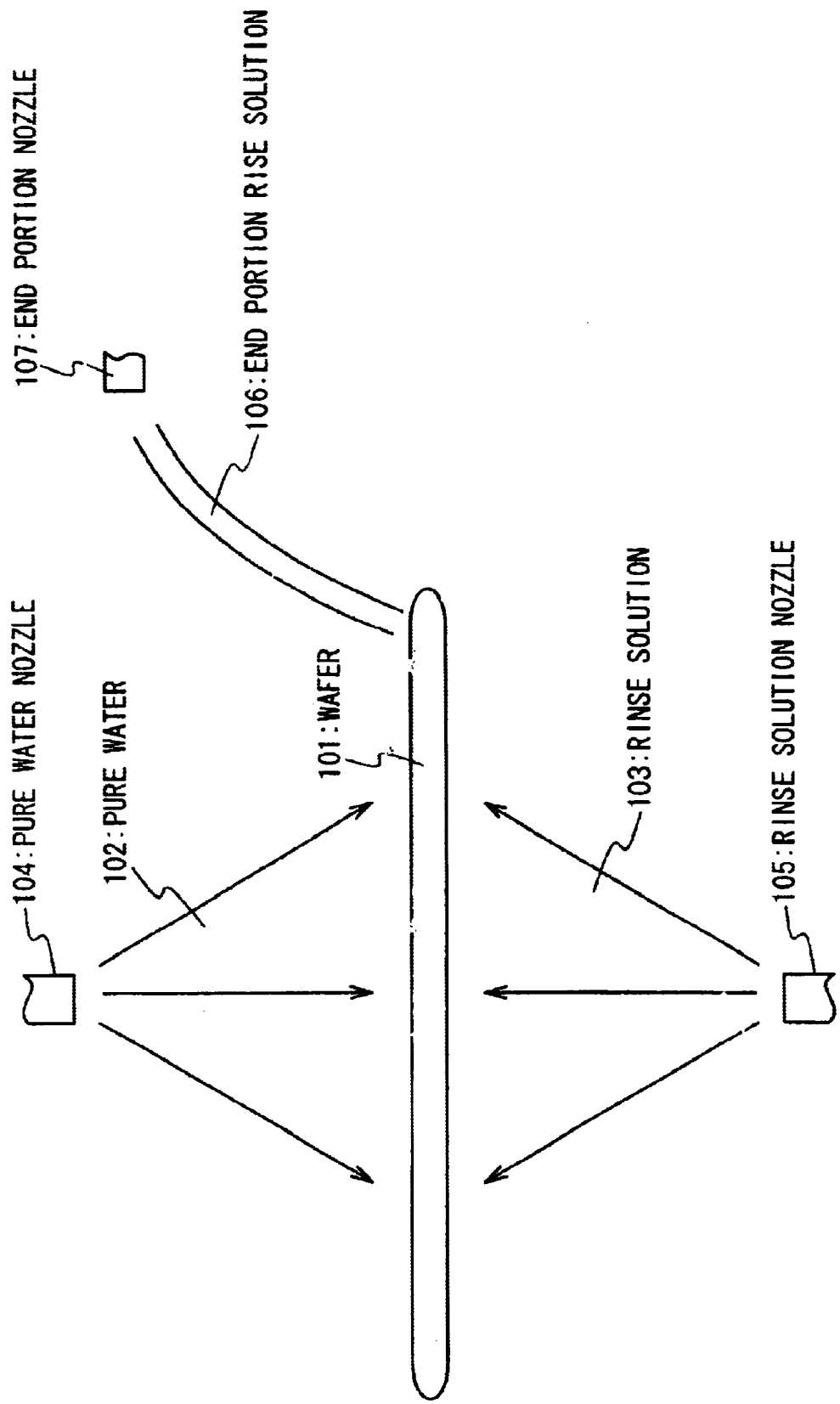

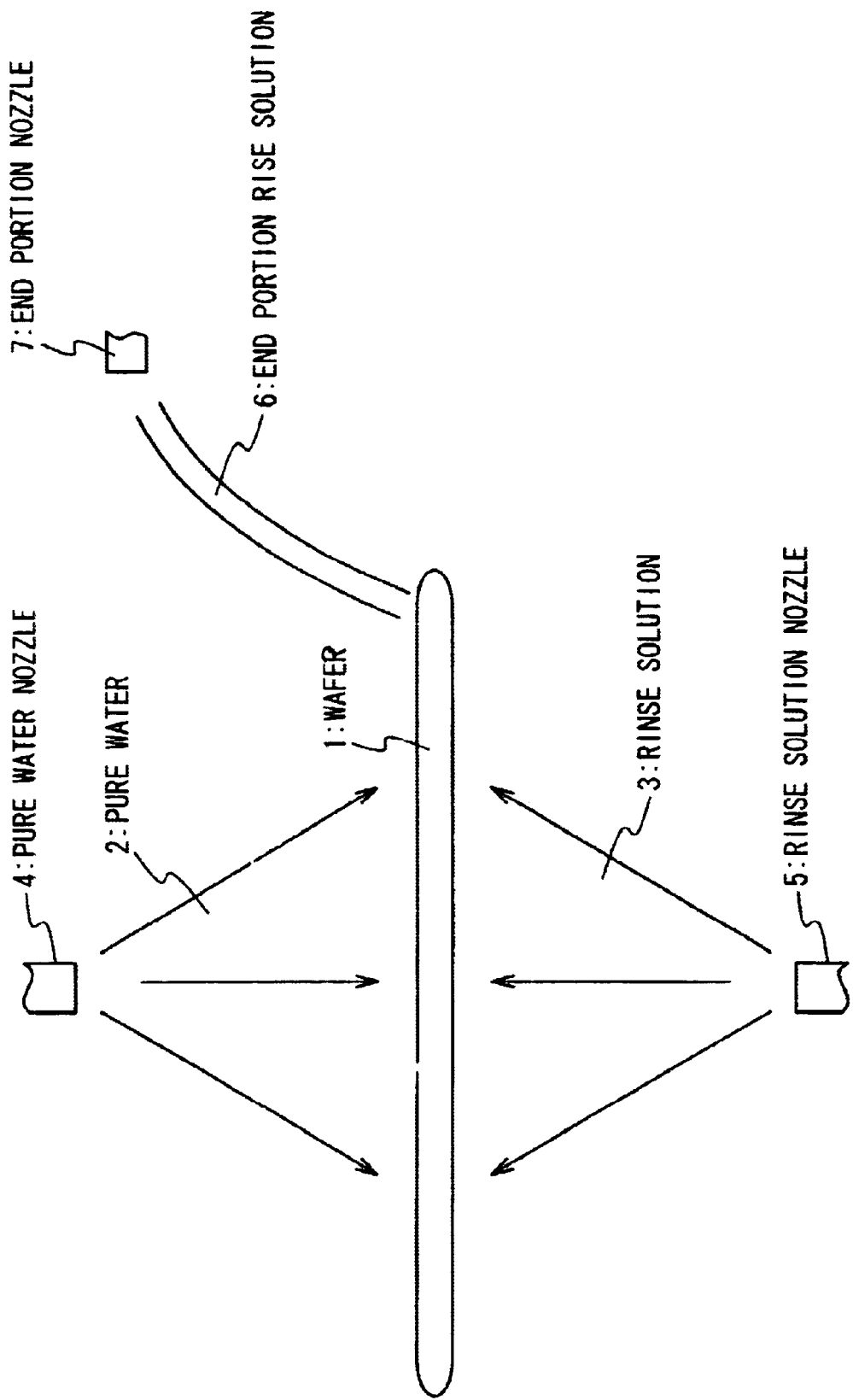

METHOD OF MANUFACTURING SEMICONDUCTOR DEVICE

BACKGROUND OF THE INVENTION

1. Field of the Invention

The present invention relates to a semiconductor device and a method of manufacturing a semiconductor device. More particularly, the present invention relates to a wet processing method of protecting a copper wiring pattern.

2. Description of the Related Art

With the enlargement of a chip size and the miniaturization of a minimum processing dimension, a parasitic capacitance and a wiring line resistance increase to cause a wiring delay. In order to avoid it, an interlayer insulating film with a low dielectric constant is used for decrease of the parasitic capacitance. Also, a copper wiring with a small resistance is used for decrease of the wiring line resistance. Thus, by using the interlayer insulating film with the low dielectric constant for decrease of the capacitance C and using copper for the wiring line for decrease the resistance R, the wiring delay ($\Xi RC$) can be reduced.

In order to decrease the wiring line resistance, it is also important to decrease an average wiring line length. Since the average wiring line length is inversely proportional to the number of wiring layers, a multiple-layer technique of the wiring layers is important. For this purpose, a damascene wiring structure technique and a chemical mechanical polishing (CMP) technique become essential which can attain the multiple-layer structure without involving concave and convex portions on the surface of a lower layer.

The CMP polishing is a step for precisely polishing a surface by using abrasive material in a process for manufacturing a semiconductor device. The CMP polishing precisely flattens an upper portion of a lower layer so as not to form any concave and convex portions on an upper layer. The manufacturing step is the very fine step. Thus, the high technique is required for the abrasive material, a polishing condition, a polishing apparatus, a rinsing method and the like.

The problems in the CMP of the conventional technique will be described below. The conventional technique will be described below with reference to FIG. 1. FIG. 1 is a diagram showing a step of rinsing after a CMP process is ended. FIG. 1 shows a wafer 101, pure water 102, a pure water nozzle 104, a rinse solution 103 and a rinse solution nozzle 105. Here, FIG. 1 shows a step of rinsing the back side of the wafer 101, in which the rinsing of the front side of the wafer 101 is ended after an unnecessary portion of a wiring film is CMP-polished.

On the wafer 101 are formed semiconductor devices such as semiconductor element, interlayer insulating films, damascene wiring lines and the like.

The pure water 102 is of a super high purity used to manufacture a semiconductor. The pure water 102 has a function of covering the front surface of the wafer 101 and thereby protecting impurities and the rinse solution 103 from going from back side to the front side.

The pure water nozzle 104 is provided to discharge the pure water 102 onto the front surface of the wafer 101.

The rinse solution 103 is used to remove abrasive residuals and contaminants which go onto the back side through the CMP polishing operation on the front side of the wafer 101.

The rinse solution nozzle 105 is provided to discharge the rinse solution 103 onto the back side of the wafer 101.

The front surface of the wafer 101 is rinsed after the formation of the copper damascene wiring line by the CMP polishing operation. After that, as shown in FIG. 1, the back side of the wafer 101 is rinsed by the rinse solution 103. At this time, the pure water 102 is discharged onto the front surface of the wafer 101 so that the contaminants on the back side do not go onto the side of the front surface.

The states of the damascene wiring line at this time will be described with reference to FIGS. 2A and 2B.

FIGS. 2A and 2B are cross sectional views showing the damascene wiring lines of the wafer 101. FIGS. 2A and 2B show a substrate 111, an insulating film 112, a barrier film 113, a wiring film 114 and a wiring line groove 115.

The substrate 111 is a semiconductor substrate on which semiconductor elements, (interlayer) insulating films, damascene wiring lines and the like are formed. The substrate 111 may be a semiconductor substrate formed of silicon, or a semiconductor substrate on which an insulating film formed of silicon dioxide and silicon nitride is formed.

The insulating film 112 is formed using an organic material such as a polymer of a hydrocarbon system or using an inorganic material such as silicon dioxide.

The barrier film 113 is a thin metal film. The barrier film 113 protects the interlayer insulating film 112 from being exposed to plasma, and also protects the wiring line film 114 from being diffused into the insulating film 112. The barrier film 113 is formed of titanium nitride, tantalum and the like.

The wiring line film 114 is formed of a metal with a low specific resistance. The wiring line film 114 is formed in a wiring line groove in the insulating film, and functions as the damascene wiring line. For example, the wiring line film 114 is formed of copper.

In FIG. 2A, the side of the front surface of the substrate 111 is rinsed after the damascene wiring line is formed in the wiring line groove 115 through the CMP polishing operation. After that, the back side of the substrate 111 is rinsed by the rinse solution 103 as shown in FIG. 1. When the back side is rinsed, the pure water 102 is sent onto the front side. The pure water 102 is sent in order to protect the rinse solution 103 for rinsing the back side from going onto the front surface. Next, FIG. 2B shows a cross sectional view when the back side rinsing is ended. In FIG. 2B, it is known that side slits are formed on the boundary between the wiring line film 114 and the barrier film 113.

In this way, the side slits occurs irrespectively of the stage at which the rinsing of the surface is ended after the completion of the CMP polishing operation. This is because the wiring line film 114 of copper is etched with the CMP polishing solution slightly remaining on the front surface and the pure water 102. Also, although being not shown, there may be a possibility that a pit is induced on the front surface through the etching.

Consequently, not only a sectional area of the wiring line is reduced, but also a location dependency occurs. That is, concave and convex portions are formed, which may result in a disturbance in a step coverage of an interlayer insulating film.

FIG. 3 is a view showing a different process of a rinsing after the CMP process is ended. FIG. 3 shows a wafer 101, pure water 102, a pure water nozzle 104, a rinse solution 103, a rinse solution nozzle 105, an end portion rinse solution 106 and an end portion nozzle 107. Here, FIG. 3 shows the process in which after an unnecessary portion of a wiring line film is polished through the CMP polishing operation, the rinsing on the front surface of the wafer 101 is ended, and the rinsing of the back side thereof and the removal of metal components of a surface edge are carried out at the same time.

The end portion rinse solution 106 is used for rinsing and removing the metal portion on the edge of the surface.

The end portion nozzle 107 is provided to supply the end portion rinse solution 106.

The other structures from the wafer 101 to the rinse solution nozzle 105 are as mentioned above. Thus, their description is omitted.

Also, in this case, the phenomenon shown in FIGS. 2A and 2B is brought about similarly to the above-mentioned case. The side slit is induced on the boundary of the barrier film of the damascene wiring line. Thus, it is difficult to effectively decrease the wiring line resistance. There may be a problem even in the step coverage of the interlayer insulating film.

In conjunction with to the above-mentioned description, Japanese Laid Open Patent Application (JP-A, 2001-89747) discloses a polishing composition and a polishing method. In this reference, a composition containing a benzotriazole derivative is used as the polishing composition when the CMP polishing operation is carried out. The copper CMP polishing operation is carried out by using the composition containing the benzotriazole derivative. Consequently, a protection film is formed on a copper surface, and the corrosion after the polishing operation is protected. In addition, a copper film polishing rate is suppressed.

Also, Japanese Laid Open Patent Application (JP-A-P2000-315666A) discloses a method of manufacturing a semiconductor integrated circuit device. In this reference, a polishing solution containing anticorrosive is used as polishing solution when the CMP polishing operation is carried out. The anticorrosive is medicine for forming a corrosive resistant protection film on a metal surface and thereby suppressing the progress of the polishing through the CMP polishing operation. Here, benzotriazole is used. Then, while a copper CMP polishing operation is carried out, the protection film is formed on the copper surface. Consequently, the corrosion after the polishing operation is protected. In addition, the copper film polishing rate is suppressed.

Japanese Laid Open Patent Application (JP-A-P2000-12543A) discloses a method of manufacturing a semiconductor integrated circuit device. In this reference, a slurry containing benzotriazole is used as a polish slurry when the CMP polishing operation is carried out. The usage of the slurry containing benzotriazole enables the polishing operation while the surface of a copper film is protected. Thus, it is possible to polish the copper film in which the corrosion of the copper film and the dishing are suppressed without any large reduction in a throughput.

Japanese Laid Open Patent Application (JP-A-Heisei 8-83780) discloses an abrasive material and a polishing method. In this reference, an abrasive material containing benzotriazole is used as the abrasive material when the CMP polishing operation is carried out. The usage of the abrasive material containing benzotriazole protects the surface of a copper film, and suppresses an isotropic chemical and mechanical polishing operation. Thus, only a convex surface of the polished film is removed by the mechanical polishing operation. Hence, it is possible to carry out the polishing operation in which the dishing is little.

Japanese Laid Open Patent Application (JP-A-Heisei, 8-64594) discloses a method of forming a wiring line. In this reference, abrasive particle solution containing benzotriazole is used as abrasive particle solution when the CMP polishing operation carried out. The usage of the abrasive material containing benzotriazole enables the protection of the surface of a copper film and the protection of the generation of the corrosion. Thus, it is possible to protect the surface corrosion during the formation of a metal wiring line during the polishing operation and after the formation, and thereby possible to protect the deterioration in a quality.

Japanese Laid Open Patent Application (JP-A-Heisei, 5-315331) discloses a method of manufacturing a semiconductor device and a rinsing apparatus. In this reference, a copper wiring line is rinsed by using a water solution containing benzotriazole after the formation of the copper wiring line. The usage of the water solution containing benzotriazole enables a protection film (Cu-BTA) to be formed on the surface of the copper film, and thereby possible to protect the corrosion of the copper wiring.

SUMMARY OF THE INVENTION

Therefore, an object of the present invention is to provide a method of manufacturing a semiconductor device, which can reduce damage to a damascene wiring line surface in a wet process to a wafer on which a damascene wiring line is formed.

Another object of the present invention is to provide a method of manufacturing a semiconductor device, which can protect a damascene wiring line surface in rinsing the back side of a wafer on which the damascene wiring line is formed.

Still another object of the present invention is to provide a method of manufacturing a semiconductor device, which can protect a damascene wiring line surface, in removing a metal on a surface edge of a wafer on which the damascene wiring line is formed.

It is another object of the present invention to provide a method of manufacturing a semiconductor device, which can stabilize a wiring line resistance and reduce a wiring delay.

Another object of the present invention is to provide a method of manufacturing a semiconductor device, which can improve a wiring reliability without any decrease in a throughput.

In an aspect of the present invention, a method of manufacturing a semiconductor device is achieved by (a) forming an insulating film on a semiconductor substrate, by (b) forming a wiring line groove in the insulating film, by (c) forming a conductive film to fill the wiring line groove and to cover the insulating film, by (d) removing the conductive film using a CMP polishing method until the insulating film is exposed, to complete a wiring line, by (e) rinsing a front side of the semiconductor substrate on which the wiring line is formed, and by (f) rinsing a back side of the semiconductor substrate while supplying to the front side of the semiconductor substrate, a protection solution for forming a protection film in an exposed surface of the wiring line.

It is desirable that the conductive film is copper.

Also, it is desirable that the protection solution contains benzotriazole or benzotriazole derivative. The concentration of benzotriazole or benzotriazole derivative in the protection solution is desirably in a range of 0.01 to 0.1 wt %.

In another aspect of the present invention, a method of manufacturing a semiconductor device is achieved by (a) forming an insulating film on a semiconductor substrate, by (b) forming a wiring line groove in the insulating film, by (c) forming a first conductive film to cover an inner wall surface of the wiring line groove and the insulating film, by (d)

forming a second conductive film to fill the wiring line groove and to cover the first conductive film, by (e) removing the first and second conductive films using a CMP polishing method until the insulating film is exposed, to complete a wiring line, by (f) rinsing a front side of the semiconductor substrate, on which the wiring line is formed, and by (g) rinsing a back side of the semiconductor substrate while supplying to the front side of the semiconductor substrate, a protection solution for forming a protection film in an exposed surface of the wiring line.

It is desirable that the conductive film is copper.

Also, it is desirable that the protection solution contains benzotriazole or benzotriazole derivative. The concentration of benzotriazole or benzotriazole derivative in the protection solution is desirably in a range of 0.01 to 0.1 wt %.

In another aspect of the present invention, a method of manufacturing a semiconductor device is achieved by (a) forming a first damascene wiring line above a semiconductor substrate using a conductive film, by (b) forming an upper insulating film on the damascene wiring line, by (c) forming a via-hole to pass through the upper insulating film to the first damascene wiring line, by (d) forming a second damascene wiring line in the via-hole, and by (e) rinsing a front side of the semiconductor substrate with a protection solution for protecting an exposed surface of the second damascene wiring line.

It is desirable that the conductive film is copper.

Also, it is desirable that the protection solution contains benzotriazole or benzotriazole derivative. The concentration of benzotriazole or benzotriazole derivative in the protection solution is desirably in a range of 0.01 to 0.1 wt %.

In another aspect of the present invention, a method of manufacturing a semiconductor device is achieved by (a) forming a damascene wiring line above a semiconductor substrate using a conductive film, by (b) rinsing a front side of the semiconductor substrate on which the damascene wiring line is formed, and by (c) rinsing a back side of the semiconductor substrate while rising the front side of the semiconductor substrate with a protection solution for protecting an exposed surface of the damascene wiring line.

BRIEF DESCRIPTION OF THE DRAWINGS

FIG. 3 is diagram showing another rinsing process in a conventional method of manufacturing a semiconductor device;

FIG. 6 is a diagram showing a rinsing process in the method of manufacturing a semiconductor device according to a second embodiment of the present invention;

DESCRIPTION OF THE PREFERRED EMBODIMENTS

Hereinafter, a method of manufacturing a semiconductor device of the present invention will be described in detail with reference to the attached drawings.

A semiconductor device having a metal wiring line for one layer will be described below. However, the present invention can be applied to the method of manufacturing a semiconductor device having a multiple-layer wiring structure.

(First Embodiment)

The method manufacturing a semiconductor device according to the first embodiment of the present invention will be described below with reference to the attached drawings.

Figure 4:
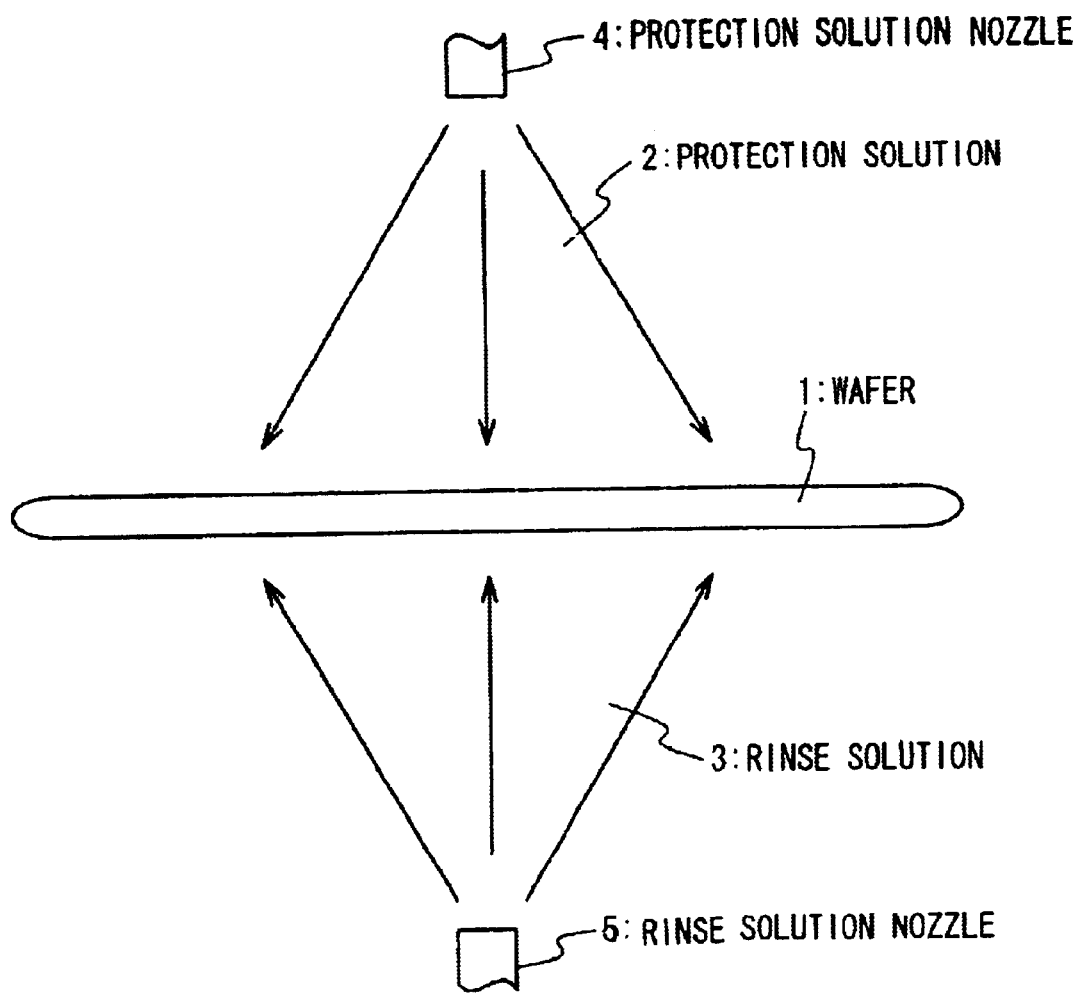
FIG. 4 is diagram showing a rinsing process in a method of manufacturing a semiconductor device according to a first embodiment of the present invention.

FIG. 4 is a diagram showing a step in relation to the method of manufacturing a semiconductor device according to the first embodiment of the present invention. FIG. 4 shows a wafer 1, a protection solution 2, a protection solution nozzle 4, a rinse solution 3 and a rinse solution nozzle 5. Here, FIG. 4 shows a step of rinsing the back side of the wafer 1, in which the rinsing of the front surface of the wafer 1 is ended after an unnecessary portion of a wiring line film is polished through the CMP polishing operation.

The wafer 1 is a semiconductor substrate having one or plurality of semiconductor devices. In the respective processes in the manufacturing method, insulating films, semiconductor elements, interlayer insulating films, damascene wiring lines and the like are formed on the surface. In this embodiment, the wafer 1 is the semiconductor wafer, in which the copper wiring line films 14 is polished by a chemical mechanical polishing method (CMP) and the polished surface is then rinsed.

The protection solution 2 is obtained by mixing a protective solution and a pure water of a super high purity is used to manufacture a semiconductor. The protection solution 2 is supplied onto the surface of the wafer 1, and has a function of covering the surface side and protecting impurities and the rinse solution 3, to be described later, from going from back side to the front side. The protection solution is the material that can be supplied onto the wiring line film 14 to thereby form a protection film for protecting the surface of the wiring line film 14. For example, benzotriazole, benzotriazole derivative and the like are known. In the first embodiment, benzotriazole (hereafter, referred to as BTA) is used. Also, the concentration of a pure water solution of the BTA (hereafter, referred to as a BTA water solution) is assumed to be so sufficient high concentration that any side slit is not induced on the surface when the back side is rinsed. Preferably, the concentration is 0.01 wt % to 0.1 wt %. In the first embodiment, the concentration of 0.04 wt % is used.

The rinse solution 3 is used for rinsing the back side of the wafer 1. The rinse solution 3 is the material that can remove and rinse the metal contaminants and the polishing residuals going onto the back side through the CMP polishing operation on the front surface of the wafer 1 and the surface rinsing operation after that. In the first embodiment, a solution in which hydrofluoric acid and hydrogen peroxide water are mixed (hereafter, referred to as FPM) is used. The FPM concentration is the concentration at which the polishing residuals, the metal contaminants and the like can be removed.

The protection solution nozzle 4 is provided to supply the protection solution 2 onto the front surface of the wafer 1. The protection solution nozzle 4 can supply the protection solution 2 at a constant pressure and a constant flow rate.

The rinse solution nozzle 5 is provided to discharge the rinse solution 3 onto the back side of the wafer 1. The rinse solution nozzle 5 can supply the rinse solution 3 at a constant pressure and a constant flow rate.

After the formation of the copper damascene wiring line (CMP), the front surface of the wafer 1 on which the CMP is performed is rinsed. After that, the back side of the wafer 1 is rinsed by the rinse solution 3, as shown in FIG. 4. At this time, the protection solution 2 is supplied onto the front surface so that the contaminants on the back side do not go onto the surface side.

The situation of the damascene wiring line at this time will be described by using FIGS. 5A to 5C.

Figure 5A:
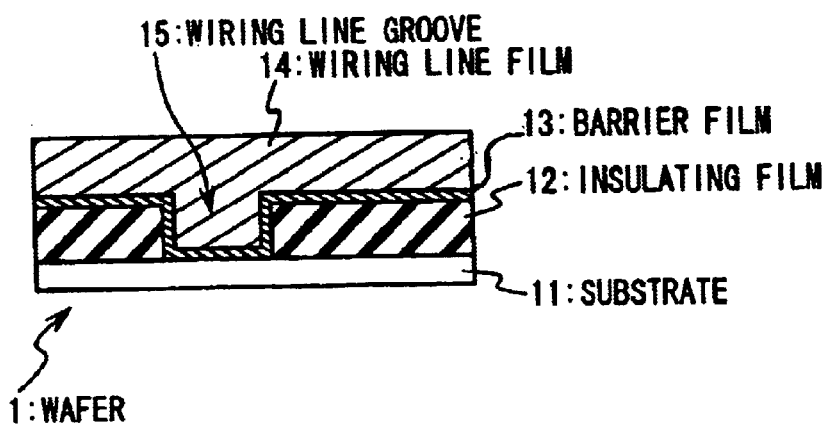
FIGS. 5A to 5C are cross sectional views showing steps of a method of manufacturing a semiconductor device of the present invention.
Figure 5B:
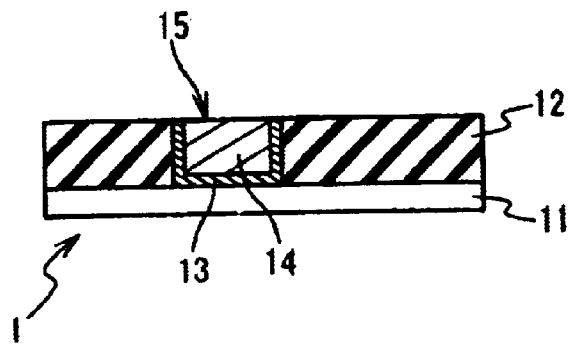
Figure 5C:
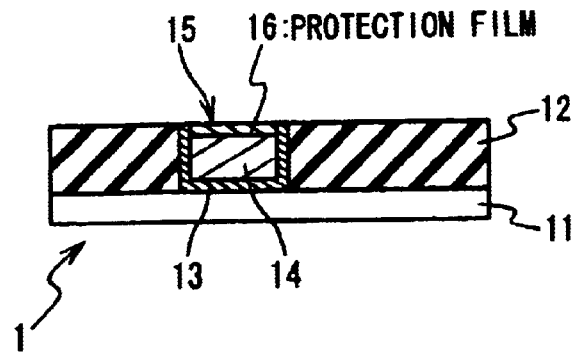

FIGS. 5A to 5C are the cross sectional views showing the damascene wiring line of the wafer 1. FIGS. 5A to 5C show a substrate 11, an insulating film 12, a barrier film 13, a wiring line film 14 and a wiring line groove 15 on the substrate 11.

On the semiconductor substrate 11, are formed semiconductor elements, wiring lines and the like. The semiconductor substrate 11 may be a semiconductor substrate formed of silicon, or a semiconductor substrate on which an inorganic insulating film formed of silicon dioxide and silicon nitride is formed. Or, the semiconductor substrate 11 may be the semiconductor substrate having a multiple-layer structure of an insulating film in which a plurality of wiring structures and elements are embedded. In this embodiment, the semiconductor substrate 11 is a silicon substrate on which a silicon dioxide film is formed The insulating film 12 is formed on the substrate 11 by using a sputtering method, a CVD method, a spin coating method and the like. An inorganic or organic material having a low dielectric constant is used. Portions between the wiring lines, between the wiring line and the element and between the elements are insulated. The inorganic material is used such as silicon dioxide and silicon nitride. Also, silicon dioxide may be used which is doped with an organic material, an organic group, hydrogen, a hydroxyl group or the like as impurity. The insulating film 12 has a function as a polishing stopper when the barrier film 13 is polished through the CMP polishing operation. The film thickness of the insulating film 12 is about 500 nm. In this embodiment, it is designed as a two-layer structure. The lower layer is an insulating film in which an organic material is used such as a polymer of a hydrocarbon system, and the upper layer is an inorganic insulating film such as silicon dioxide.

The barrier film 13 is formed as a thin metal film on the insulating film 12 and on a wall surface (inner surface) of the wiring line groove 15 by using a sputtering method, a depositing method, a CVD method and the like. The barrier film 13 protects the insulating film 12 from being exposed to plasma and the like in the process for forming the damascene wiring line. Also, the barrier film 13 protects the wiring line film 14 from being diffused into the insulating film 12. The barrier film 13 is formed of a high melting point metal or its nitride. For example, the barrier film 13 is formed of tantalum, tantalum nitride, titanium nitride and a lamination film composed of them. In this embodiment, the barrier film 13 is formed of the tantalum nitride, and the film thickness of the barrier film 13 is about 30 nm.

The wiring line film 14 is formed as a metal film so as to fill the wiring line groove 15 and to cover the barrier film 3, by using a sputtering method, a depositing method, a plating method and the like. Finally, a portion of the wiring line film 14 formed in the wiring line groove 15 becomes the damascene wiring line. The wiring line film 14 is formed of a metal with a low specific resistance. For example, the metal is copper, aluminum or tungsten. The copper is used in this embodiment. Typically, the film thickness of the wiring line film 14 is 1300 nm (=500 nm for the wiring line groove 15 (insulating film 12)+800 nm above the wiring line, immediately after the film formation before the formation of the wiring line groove).

In the wiring line groove 15, a metal wiring line is formed to form the damascene wiring line. The wiring line groove 15 is formed so as to extend into the insulating film 12, by using a photolithography technique. In this embodiment, the depth of the wiring line groove 15 is 500 nm, and the width of the wiring line groove 15 is 200 nm.

The protection film 16 is formed on the surface of the wiring line film 14 by supplying the protection solution 2 in FIG. 4. The protection film 16 has a function of protecting the film, when the impurities and the rinse solution 3 flow from the back side to the front side, and also protecting the wiring line film 14 of copper from being etched by the CMP polishing solution slightly remaining on the surface and the pure water on the surface side. In this embodiment, the protection film 16 is in the passive state film formed by the coupling of copper and benzotriazole.

The steps of the method of manufacturing the semiconductor device according to the first embodiment of the present invention will be described with reference to the attached drawings.

The section of the semiconductor device shown in FIG. 5A is formed by the following steps.

At first, the insulating film 12 of the lower layer (hereafter, referred to as a first insulating film) is formed on the substrate 11 by a spin coating method. Next, the insulating film 12 of the upper layer (hereafter, referred to as a second insulating film) is formed on the first insulating film by a plasma method. Then, the wiring line groove 15, which penetrates the second insulating film and extends into the first insulating film (extends into the insulating film 12) by a photolithography process. After that, by using a sputtering method, the barrier film 13 is formed on the insulating film 12 so as to cover the inner surface of the wiring line groove 15. Then, the wiring line film 14 is formed so as to cover the barrier film 13 by using a sputtering method.

Next, a first CMP polishing operation of the wiring line film 14 is carried out by using the barrier film 13 as a stopper. Thus, a portion of the wiring line film 14 above the barrier film 13 is removed.

Subsequently, a second CMP polishing operation of the barrier film 13 is carried out by using the insulating film 12 as a stopper. Thus, the barrier film 13 above the insulating film 12, a portion of the wiring line film 14 above the insulating film 12 in the wiring line groove 15 and the barrier film 13 are removed. The formation of the copper damascene wiring line is ended by the above-mentioned processes. FIG. 5B shows that situation.

In FIG. 5B, the front side of the surface of the wafer 1 is rinsed after the damascene wiring line is formed in the wiring line groove 15 through the CMP polishing operation. The rinsing operation is carried out by a dedicated rinsing apparatus (or a dedicated rinsing unit) (not shown). Contaminative metals and contaminative particles on the front surface caused by the polishing operation and the like are removed by this rinsing operation.

Subsequently, the back side of the substrate 11 is rinsed by the rinse solution 3 as shown in FIG. 4. The contaminative metals and the contaminative particles on the back side caused by the polishing operation or the invasion from the front surface and the like are removed by this rinsing operation. At this time, the protection solution 2 is supplied onto the front surface so that the contaminative particles and the contaminative metals and the like do not go onto the front surface.

The rinsing operation is carried out by the following procedure.

(1) Set the wafer 1 for the rinsing apparatus.

(2) Rotate the wafer 1 at 120 rpm.

(3) Supply the BTA solution as the protection solution 2 to the surface at a flow rate of 1 L/min for 60 seconds.

(4) Supply FPM solution as the rinse solution 3 to the back side at a flow rate of 1 L/min for 60 seconds, simultaneously with (3).

(5) Supply the pure water to the front side and the back side at a flow rate of 1 L/min for 30 seconds at the same time, immediately after (3) and (4).

When the back side is rinsed, the protection solution 2 is sent onto the front side. The protection solution 2 is sent in order to protect the rinse solution 3 for the back side rinsing from going onto the front side. FIG. 5C shows the situation when the back side rinsing is ended. In FIG. 5C, the thin protection film 16 is formed on the surface of the wiring line film 14 in the wiring line groove 15. Thus, any pit is not formed on the surface of the wiring line film 14 of the wiring line groove 15 through etching. Also, any side slit is not induced on the boundary between the barrier film 13 and the wiring line film 14.

This is because the BTA in the protection solution 2 functions for the formation of the passive state film through coupling of the copper and the BTA on the surface of the wiring line film 14. The protection film 16 protects the copper from being solved out into the pure water.

According to the present invention, in the back side rinsing after the completion of the front side rinsing after the CMP polishing operation, the damages such as the side slit, the pit and the like are never brought about on the surface of the damascene wiring line. Thus, the reliability is improved. That is, it is possible to stabilize the sectional area of the wiring line and to reduce the resistance of the wiring line to a small value satisfying the design.

The yield of the wiring line is improved, which leads to the improvement of the manufacturing yield of the semiconductor device itself. That is, the improvement of the reliability enables the cost to be reduced.

Also, the process carried out by using the pure water can be carried out only by using the BTA water solution. Thus, the reliability of the wiring line can be improved without any influence on the throughput. Hence, it is possible to improve the reliability of the semiconductor device.

The formation of the protection film 16 reduces the possibility that the surface of the wiring line film 14 is damaged in the process after that formation. Thus, it is possible to improve the reliability of the semiconductor device.

(Second Embodiment)

The method manufacturing a semiconductor device according to the second embodiment of the present invention will be described below with reference to the attached drawings.

FIG. 6 is a diagram showing a step of the method of manufacturing the semiconductor device according to the second embodiment of the present invention. FIG. 6 shows the wafer 1, the protection solution 2, the protection solution nozzle 4, the rinse solution 3 and the rinse solution nozzle 5, an end portion rinse solution 6 and an end portion nozzle 7. Here, FIG. 6 shows a step of rinsing the back side of the wafer 1 and removing respective films on surface edges of the wafer 1, which are carried out at the stage when the rinsing of the front surface of the wafer 1 is ended after the unnecessary portion of the wiring line film is polished through the CMP polishing operation.

The protection solution 2 is obtained by mixing the protective solution and the pure water of the super high purity used to manufacture the semiconductor. The protection solution 2 is supplied onto the surface of the wafer 1, and covers the surface side. Then, the protection solution 2 has the function to protect the contamination caused by the invasion of the impurities and the rinse solution 3 from the back side and the contamination caused by the film materials removed from the front surface edges. The protection solution 2 contains the material that can be supplied onto the wiring line film 14 to thereby form the protection film on the surface of the wiring line film 14. For example, benzotriazole, benzotriazole derivative and the like are contained. In this embodiment, benzotriazole (hereafter, referred to as the BTA) is used. Also, the concentration of the pure water solution of the BTA (hereafter, referred to as the BTA water solution) is assumed to be so sufficient concentration that the side slit is not induced on the surface when the back side is rinsed. Preferably, the concentration of the BTA in the protection solution 2 is 0.01 wt % to 0.1 wt %. In this embodiment, the concentration of 0.04 wt % is used.

The end portion rinse solution 6 is used to remove the (interlayer) insulating film, the barrier film and the wiring line film of an edge portion (the range of a width of 8 mm in a radius direction from a bevel in a periphery of the wafer) on the front surface of the wafer 1. The end portion rinse solution 6 contains the material that can remove and rinse the film of copper, the film of tantalum and tantalum nitride for the barrier film, and the film of silicon dioxide, silicon nitride, silicon carbide and silicon carbide nitride for the (interlayer) insulating film. In the second embodiment, the solution in which hydrofluoric acid and hydrogen peroxide water are mixed (hereafter, referred to as FPM) is used. The FPM concentration has the concentration at which the wiring line film on the edge, the barrier film and the (interlayer) insulating film can be removed.

The end portion nozzle 7 is provided to supply the end portion rinse solution 6 to the edge on the front surface of the wafer 1. The end portion rinse solution 6 can be supplied at a constant pressure and a constant flow rate.

The wafer 1, the rinse solution 3, the protection solution nozzle 4 and the rinse solution nozzle 5 are similar to those of the first embodiment. Thus, their description is omitted.

After the formation of the copper damascene wiring line (CMP) and in other cases, the back side is rinsed after the front surface is rinsed. At this time, the wiring line film on the edge of the front surface of the wafer 1, the barrier film and the (interlayer) insulating film are removed as necessary. At this time, as shown in FIG. 6, the back side is rinsed by the rinse solution 3, and the edge of the front surface is rinsed by the end portion rinse solution 6. At this time, the protection solution 2 is supplied onto the central portion of the front surface so that the contaminant on the back side does not go onto the element portion (the central portion) on the front side of the wafer and the contaminant on the edge do not go onto the central element portion.

The situation of the damascene wiring line at this time is described by using FIGS. 5A to 5C.

FIGS. 5A to 5C are the views showing the cross sections of the damascene wiring line of the wafer 1. FIGS. 5A to 5C show the substrate 11, the insulating film 12, the barrier film 13, the wiring line film 14 and the wiring structure 15 on the wafer 1. Those structures are similar to those of the first embodiment. Thus, their description is omitted.

The steps of the method of manufacturing the semiconductor device according to the second embodiment of the present invention will be described below with reference to the attached drawings.

The structure of the semiconductor device shown in FIGS. 5A to 5C is as described in the first embodiment. Thus, the description is omitted.

In FIG. 5B, the front side of the wafer 1 is rinsed after the damascene wiring line is formed on the wiring line groove 15 through the CMP polishing operation. The rinsing operation is carried out by the dedicated rinsing apparatus (or the dedicated rinsing unit) (not shown). The contaminative metals and the contaminative particles on the front surface produced by the polishing operation and the like are removed by this rinsing operation.

Subsequently, the back side of the wafer 1 is rinsed by the rinse solution 3, as shown in FIG. 6. The contaminative metals and the contaminative particles on the back side produced by the polishing operation or the invasion from the front surface and the like are removed by this rinsing operation. At the same time, the unnecessary wiring line film on the edge of the front surface of the wafer 1, the barrier film and the (interlayer) insulating film are removed and rinsed by the end portion rinse solution 6. At this time, the protection solution 2 is supplied onto the front surface so that the contaminative particles and the contaminative metals and the like do not go onto the portion except the edge of the surface.

The rinsing operation is carried out by the following procedure.

(1) Set the wafer 1 for the rinsing apparatus.

(2) Rotate the wafer 1 at 120 rpm.

(3) Supply the BTA water solution as the protection solution 2 to the surface at a flow rate of 1 L/min for 60 seconds.

(4) Supply the FPM as the rinse solution 3 to the back side at a flow rate of 1 L/min for 60 seconds, simultaneously with (3).

(5) Supply the FPM as the end portion rinse solution 6 only to the edge of the surface at a flow rate of 1 L/min for 60 seconds, simultaneously with (4).

(6) Supply the pure water to the front surface and the back side at a flow rate of 1 L/min for 30 seconds at the same time, immediately after (3), (4) and (5).

Here, the back side rinsing and the film removal from the edge are carried out at the same time. However, they may be separately carried out. If the film removal from the edge is carried out without rinsing the back side, the process (4) may be omitted in the above-mentioned processes (1) to (5).

When the back side rinsing and the film removal from the edge are carried out, the protection solution 2 is sent onto the front surface side. The protection solution 2 is sent in order to protect the rinse solution 3 for the back side rinsing from going onto the front surface and also to protect the contamination caused with the film materials removed from the surface edge. FIG. 5C shows the situation when the back side rinsing and the film removal from the edge are ended. In FIG. 5C, the thin protection film 16 is formed on the surface of the wiring line film 14 in the wiring line groove 15. At this time, the pit is not formed on the surface of the wiring line film 14 in the wiring line groove 15. Also, the side slit is not induced on the boundary between the barrier film 13 and the wiring line film 14.

This is because the BTA in the protection solution 2 leads to the formation of the passive state film by coupling the copper and the BTA on the surface of the wiring line film 14, and the film protects the wiring line film 14 from the etching by the CMP polishing solution slightly remaining on the front surface and the pure water and neutralizes the remaining CMP polishing solution.

According to the present invention, in the film removal from the edge and the back side rinsing after the completion of the surface rinsing after the CMP polishing operation, it is possible to exclude the damages, such as the side slit, the pit and the like, to the surface of the damascene wiring line.

(Third Embodiment)

The method manufacturing a semiconductor device according to the third embodiment of the present invention will be described below with reference to the attached drawings.

Figure 8:
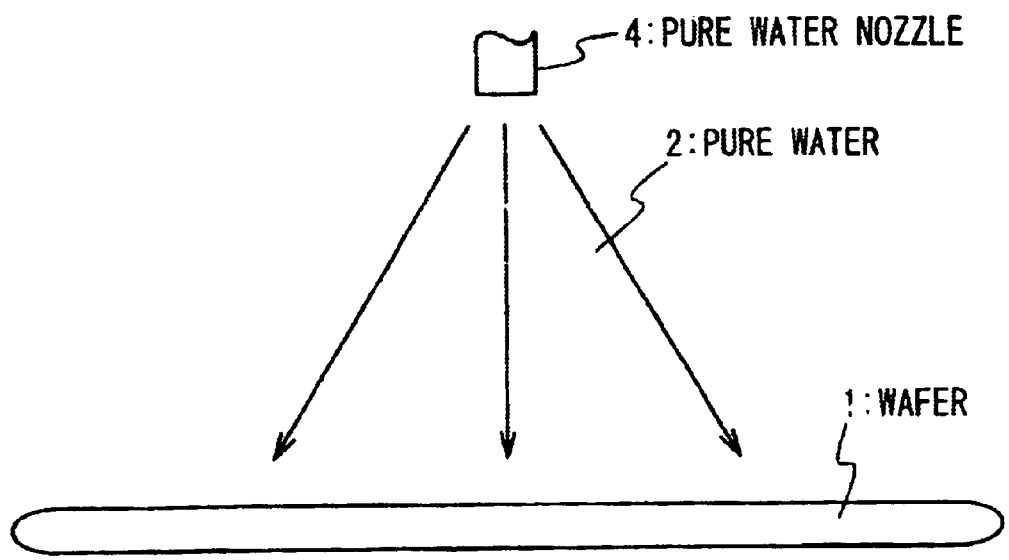
FIG. 8 is a diagram showing a rinsing process of the method of manufacturing a semiconductor device according to the third embodiment of the present invention.

FIG. 8 is a view showing a step of the method of manufacturing the semiconductor device according to the third embodiment of the present invention. FIG. 8 shows the wafer 1, the protection solution 2 and the protection solution nozzle 4. Here, FIG. 8 shows the rinsing step of forming the damascene wiring line on the wafer 1 through the CMP (the first embodiment), and laminating an insulating film on the upper layer, and then opening a via-hole towards the damascene wiring line of the lower layer on the insulating film.

The wafer 1 is the semiconductor substrate having one or more semiconductor devices. In the respective processes in the manufacturing method, the insulating film, the semiconductor element, the interlayer insulating film, the damascene wiring line and the like are formed on the substrate. In the third embodiment, after the film for the copper wiring in the damascene wiring line is polished by the chemical mechanical polishing method (CMP), the insulating film is laminated on the upper layer, and the via-hole is then opened towards the damascene wiring line of the lower layer on the insulating film.

The protection solution 2 and the protection solution nozzle 4 are similar to those of the first embodiment. Thus, their description is omitted.

The situation of the damascene wiring line of the wafer 1 is described with reference to FIGS. 7A to 7E.

FIGS. 7A to 7E show the cross sectional views of the damascene wiring line of the wafer 1. FIGS. 7A to 7E show a substrate 21, a first insulating film 22, a first barrier film 23, a first wiring line film 24, a first wiring line groove 25, an etching stopper film 26, a second insulating film 27, a second barrier film 28, a second wiring line film 29, a second wiring line groove 30, a first protection film 31 (31') and a second protection film 32, on the wafer 1.

The substrate 21 as the semiconductor substrate, the first insulating film 22, the first barrier film 23, the first wiring line film 24, the first wiring line groove 25 and the first protection film 31 are similar to the substrate 11, the insulating film 12, the barrier film 13, the wiring line film 14, the wiring line groove 15 and the protection film 16 in the first embodiment. Thus, their descriptions are omitted.

The etching stopper film 26 is the insulating film laminated on the upper portion of the structure (FIG. 5C) of the damascene wiring line formed in the first embodiment. The etching stopper film 26 functions as the etching stopper when a part of the second insulating film 27 laminated on the upper layer is dry-etched to form the second wiring line groove 30. The insulating film is used in which the kind is different from that of the second insulating film 27. In this embodiment, the etching stopper film 26 is silicon nitride. The film thickness is about 100 nm.

The second insulating film 27 is formed on the etching stopper film 26 by using a sputtering method, a CVD method, a spin coating method and the like. The insulating film is used in which the kind is different from that of the etching stopper film 26. An inorganic or organic material with a low electric constant is used to form the insulating film. The portions between the wiring lines, between the wiring and the element and between the elements are insulated. The inorganic material is used such as silicon dioxide and silicon nitride. Also, the silicon dioxide may be used which are doped with organic material, organic group, hydrogen, hydroxyl group and the like as the impurity. The second insulating film 27 functions as the polishing stopper when the second barrier film 28 is polished through the CMP polishing operation. The film thickness is about 500 nm. In this embodiment, the second insulating film 27 is formed of silicon oxide.

The second barrier film 28 is formed as a thin metal film on the second insulating film 27 and on the wall surface (inner surface) of the second wiring line groove 30 by using a sputtering method, a depositing method, a CVD method and the like. The second barrier film 28 protects the second insulating film 27 from being exposed to the plasma and the like in the process for forming the damascene wiring line. Also, the second barrier film 28 protects the second wiring line film 29 from being diffused into the second insulating film 27. The second barrier film 28 is formed of a high melting point metal or its nitride. For example, the second barrier film 28 is formed of tantalum, tantalum nitride, titanium nitride and a lamination film composed of them. In this embodiment, the second barrier film 28 is formed of tantalum nitride, and the film thickness is about 30 nm.

The second wiring line film 29 is formed as a metal film so as to fill the second wiring line groove 30 and to cover the second barrier film 28, by using a sputtering method, a depositing method, a plating method and the like. Finally, a portion formed in the second wiring line groove 30 becomes the wiring line through which the damascene wiring line of the first layers and the damascene wiring line of the second layer (the first wiring layer 24) are connected. The second wiring line film 29 is formed of a metal with a low specific resistance. For example, the metal is copper, aluminum or tungsten. The copper is used in this embodiment. Typically, the film thickness is 1400 nm (=600 nm for the second wiring line groove 30 (the etching stopper film 26+the second insulating film 27)+800 nm above the wiring, immediately after the film formation before the formation of the wiring line groove).

The second wiring line groove 30 is a via-hole for forming a metal plug to join the damascene wiring line lines between the upper and lower layers. The second wiring line groove 30 is formed so as to penetrate the second insulating film 27 and the etching stopper film 26 and arrive at the first wiring line film 24 by using a photo-graphic technique. In this embodiment, the depth is 600 nm, and the width is 200 nm.

Figure 1:
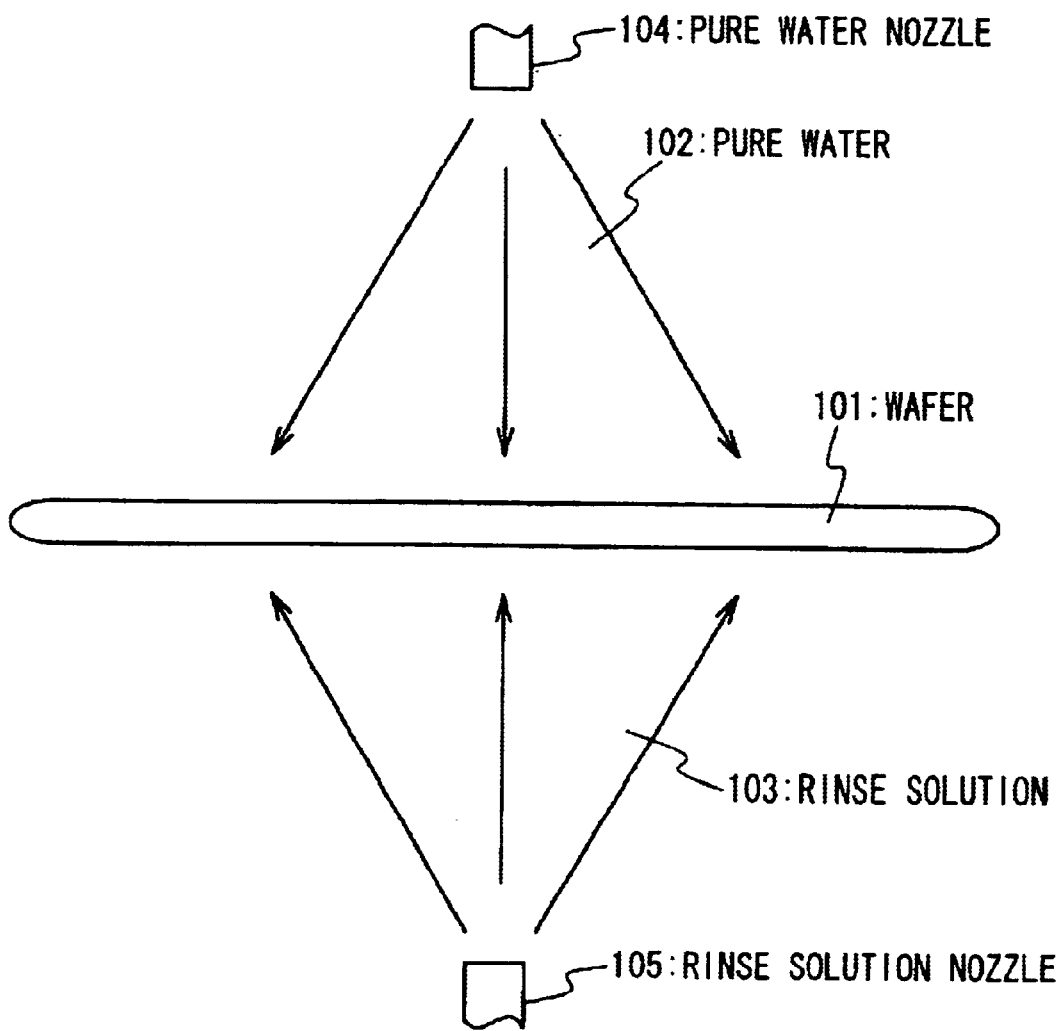
FIG. 1 is diagram showing a process of rinsing a wafer in a conventional method of manufacturing a semiconductor device.
Figure 2A:
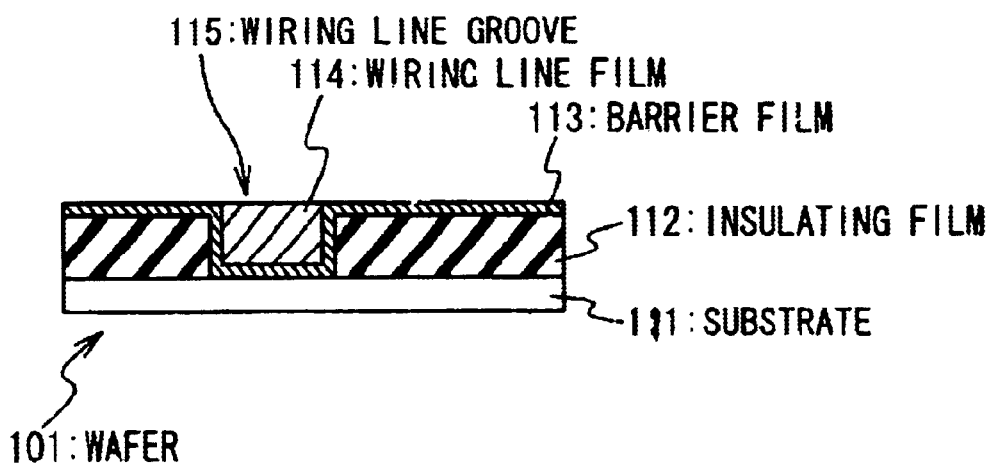
FIGS. 2A and 2B are cross sectional views showing steps of manufacturing a semiconductor device in a conventional method of manufacturing a semiconductor device.
Figure 2B:
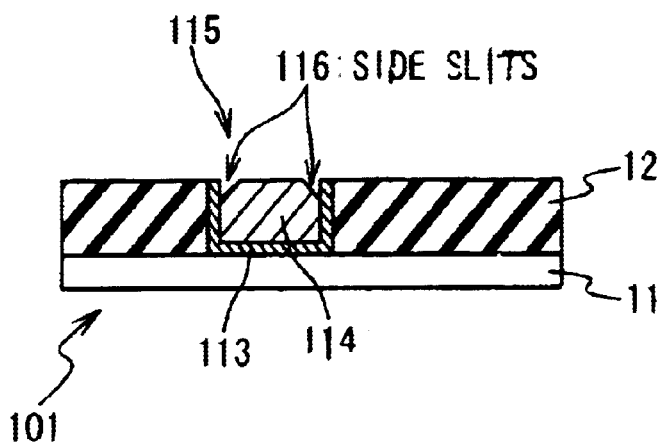

The first protection film 31' is formed on the surface of the first wiring line film 24 by supplying the protection solution 2 in FIG. 1 at the time of the back side rinsing after the CMP process, similarly to the first embodiment. The original first protection film 31 is removed by a dry etching when the via-hole (the second wiring line groove 30) is opened. The first protection film 31' is formed by supplying the protection solution 2 after that. The first protection film 31' has the function to protect the first wiring line film 24 in case of the rinsing of the via-hole and the like. In this embodiment, the first protection film 31' is the passive state film formed through the coupling of copper and benzotriazole.

The second protection film 32 is the film formed on the surface of the second wiring line film 29 by supplying the protection solution 2 in FIG. 5. The second protection film 32 has the function to protect the film from the invasion of the impurities and the rinse solution 3 from the back side and to protect the wiring line film 14 from being etched by the CMP polishing solution slightly remaining on the surface and the pure water on the surface side. In this embodiment, the second protection film 32 is the passive state film formed through the coupling of copper and benzotriazole.

The method of manufacturing the semiconductor device according to the third embodiment of the present invention will be described below with reference to the attached drawings. The cross sections of the semiconductor device shown in FIGS. 7A to 7E are formed by the following steps.

Figure 7A:
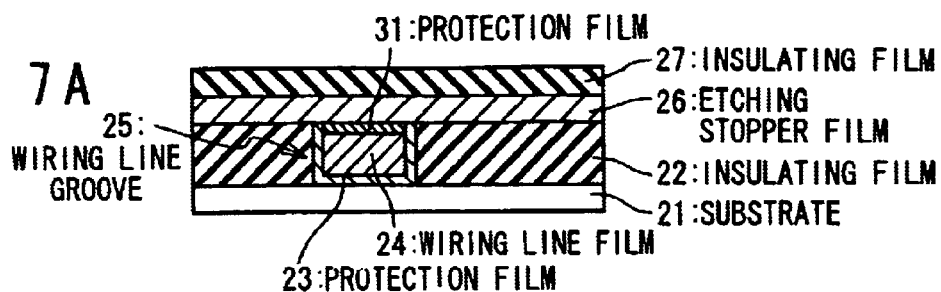
FIGS. 7A to 7E are cross sectional views showing steps of the method of manufacturing a semiconductor device according to a third embodiment of the present invention.

At first, as shown in FIG. 7A, for the semiconductor device having the structure shown in FIG. 5C formed in the first embodiment, a silicon nitride film as an etching stopper film 26 is formed on the whole upper portion of the wafer by a plasma CVD method, and a silicon dioxide film as a second insulating film 27 is then coated by a spin coating method.

Figure 7B:
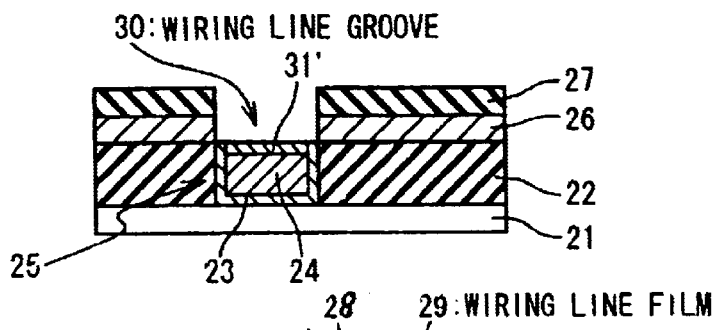

Next, as shown in FIG. 7B, after resist is patterned by a photo lithography, dry etching is carried out to open a via-hole (the second wiring line groove 30) until the via-hole penetrates the second insulating film 27 and arrive at the etching stopper film 26. After the resist is removed by oxygen plasma separation, the entire surface etching is carried out to form the via-hole (the second wiring line groove 30) with the depth at which the surface of the first wiring line film 24 is exposed by the penetration of the etching stopper film 26. Consequently, the via-hole (the second wiring line groove 30) is completed. At this time, the first protection film 31 for covering the surface of the first wiring line film 24 is also etched and removed. Here, the following processing method is used to carry out the process of the via-hole (the second wiring line groove 30) and thereby form the first protection film 31'.

The process of the via-hole (the second wiring line groove 30) is carried out by the following procedure by referring to FIG. 8.

(1) Set the wafer 1 to the rinsing apparatus.

(2) Rotate the wafer 1 at 120 rpm.

(3) Supply the BTA water solution as the protection solution 2 to the surface at a flow rate of 1 L/min for 60 seconds.

(4) Supply the pure water to the surface at a flow rate of 1 L/min for 30 seconds, immediately after the completion of (3).

In FIG. 7B, the thin first protection film 31' is formed on the surface of the first wiring line film 24. This process is common to the rinsing after the formation of the via-hole (the second wiring line groove 30). However, the damage and the pit that may be induced by the rinsing are not brought about on the surface of the wiring line film 14. Also, the side slit is not induced on the boundary between the first barrier film 23 and the first wiring line film 24. Also, it is possible to protect the exposed first wiring line film 24 from being damaged in the processes after that.

In this way, a passive state film is formed on the surface of the first wiring line film 24 through the combination of copper and BTA in the protection solution 2. Also, the passive state film protects the first wiring line film 24 from the etching action of the pure water.

It should be noted that it is possible to separately carry out the rinsing after the formation of the via-hole (the second wiring line groove 30) and the process of the BTA water solution.

Figure 7C:
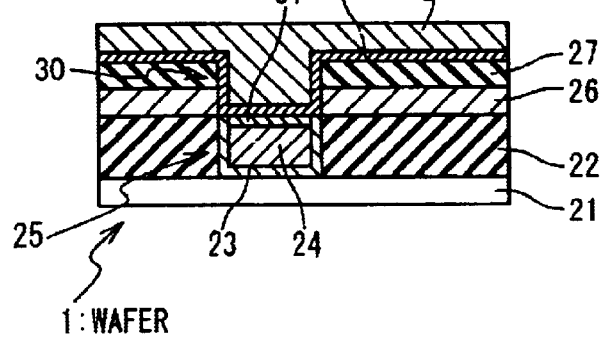

Subsequently, as shown in FIG. 7C, a sputtering method is used to form the second barrier film 28 on the second insulating film 27 so as to cover the inner wall surface of the via-hole (the second wiring line groove 30). Then, a sputtering method is used to form the second wiring line film 29 so as to fill the via-hole (the second wiring line groove 30) and to cover the second barrier film 28.

Next, a first CMP polishing operation of the second insulating film 29 is carried out by using the second barrier film 28 as the stopper. Thus, a part of the second wiring line film 29 above the second barrier film 28 is removed.

Subsequently, a second CMP polishing operation of the second barrier film 28 is carried out by using the second insulating film 27 as the stopper. Thus, a part of the second barrier film 28 above the second insulating film 27, and a part of the second wiring line film 29 above the second insulating film 27 in the via-hole (the second wiring line groove 30) are removed.

Figure 7D:
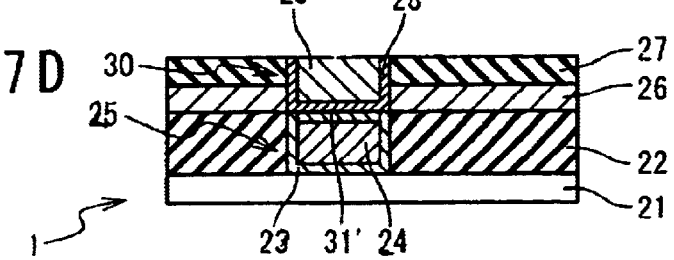
Figure 7E:
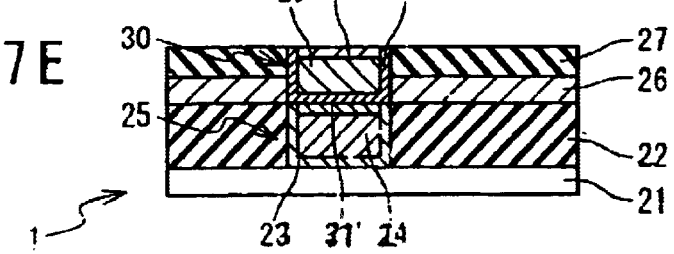

As a result, as shown in FIG. 7D, the formation of the wiring line in the copper via-hole is ended by the above-mentioned processes.

In FIG. 7D, the front side of the surface (the second wiring line groove 30) of the wafer 1 is rinsed after the wiring of the via-hole is formed on the second wiring line groove 30, through the CMP polishing operation. The rinsing operation is carried out by the dedicated rinsing apparatus (or the dedicated rinsing unit) (not shown). The contaminative metals and the contaminative particles on the surface produced by the polishing operation and the like are removed by this rinsing operation.

Subsequently, the back side is rinsed while the protection solution 2 is sent to the surface, at the step described in the first embodiment. Then, the second protection film 32 is formed on the second wiring line film 29. The detailed step is similar to that of the first embodiment. Thus, the description is omitted.

The formation of the thin second protection film 32 disables the pit produced by the etching to be brought about on the surface of the second wiring line film 29 of the second wiring line groove 30. Then, the side slit is never induced on the boundary between the second barrier film 28 and the second wiring line film 29.

In this way, a passive state film through the combination of copper and BTA in the protection solution 2 is formed on the surface of the second wiring line film 29, and the passive state film protects the second wiring line film 29 from the etching caused by the CMP polishing solution slightly remaining on the surface and the pure water and neutralizes the remaining CMP polishing solution.

According to the present invention, the damages such as the side slit, the pit and the like can be excluded from the surface of the damascene wiring line, in the back side rinsing operation after the completion of the front surface rinsing operation after the CMP polishing operation. Also, when the via-hole (the second wiring line groove 30) is formed, the protection film of the exposed wiring line can be formed to thereby protect the damage and the deterioration.

According to the present invention, it is possible to improve the reliability of the wiring line and to reduce the damage to the damascene wiring line when the semiconductor device is manufactured, without the increase in the manufacturing cost.

What is claimed is:

1. A method of manufacturing a semiconductor device, comprising:
   forming an insulating film on a semiconductor substrate;
   forming a wiring line groove in said insulating film;
   forming a conductive film to fill said wiring line groove and to cover said insulating film;
   removing said conductive film using a chemical mechanical polishing method until said insulating film is exposed, to complete a wiring line;
   rinsing a front side of said semiconductor substrate on which said wiring line is formed; and
   rinsing a backside of said semiconductor substrate while supplying to said front side of said semiconductor substrate, a protection solution which forms a protection film on an exposed surface of said wiring line.

2. The method according to claim 1, wherein said conductive film comprises copper.

3. The method according to claim 1, wherein said protection solution comprises at least one of a benzotriazole and a benzotriazole derivative.

4. The method according to claim 3, wherein a concentration of said at least one of a benzotriazole and a benzotriazole derivative in said protection solution is in a range of 0.01 to 0.1 wt %.

5. A method of manufacturing a semiconductor device, comprising:
   forming an insulating film on a semiconductor substrate;
   forming a wiring line groove in said insulating film;
   forming a first conductive film to cover an inner wall surface of said wiring line groove and said insulating film;
   forming a second conductive film to fill said wiring line groove and to cover said first conductive film;
   removing said first and second conductive films using a CMP polishing method until said insulating film is exposed, to complete a wiring line;
   rinsing a front side of said semiconductive substrate, on which said wiring line is formed; and
   rinsing a backside of said semiconductor substrate while supplying to said front side of said semiconductor substrate, a protection solution which forms a protection film on an exposed surface of said wiring line.

6. The method according to claim 5, wherein said second conductive film comprises copper.

7. The method according to claim 5, wherein said protection solution comprises at least one of a benzotriazole and a benzotriazole derivative.

8. The method according to claim 7, wherein a concentration of said at least one of a benzotriazole and a benzotriazole derivative in said protection solution is in a range of 0.01 to 0.1 wt %.

9. A method of manufacturing a semiconductor device, comprising:
   forming a first damascene wiring line above a semiconductor substrate using a conductive film;
   forming an upper insulating film on said first damascene wiring line;
   forming a via-hole to pass through said upper insulating film to said first damascene wiring line;
   forming a second damascene wiring line in said via-hole; and
   rinsing a backside of said semiconductor substrate while rinsing a front side of said semiconductor substrate with a protection solution which forms a protection film on an exposed surface of said second damascene wiring line.

10. The method according to claim 9, wherein a metal of said first and second damascene wiring lines comprises copper.

11. The method according to claim 9, wherein said protection solution comprises at least one of a benzotriazole and a benzotriazole derivative.

12. The method according to claim 11, wherein a concentration of said at least one of a benzotriazole and a benzotriazole derivative in said protection solution is in a range of 0.01 to 0.1 wt %.

13. The method of manufacturing a semiconductor device, comprising:

forming a damascene wiring line above a semiconductor substrate using a conductive film;

rinsing a front side of said semiconductor substrate on which said damascene wiring line is formed; and rinsing a backside of said semiconductor substrate while rinsing said front side of said semiconductor substrate with a protection solution which forms a protective film on an exposed surface of said damascene wiring line.

14. The method according to claim 1, further comprising:

forming a barrier film on said insulating film and an inner wall surface of said wiring line groove with a barrier film.

15. The method according to claim 5, further comprising:

forming a barrier film on said insulating film and an inner wall surface of said wiring line groove.

16. The method according to claim 14, wherein said removing said conductive film comprises removing a portion of said barrier film.

17. The method according to claim 15, wherein said removing said conductive film comprises removing a portion of said barrier film.

18. The method according to claim 1, further comprising:

supplying said protection solution at a predetermined pressure.

19. The method according to claim 1, further comprising:

supplying said protection solution at a flow rate of 1 L/min.

20. The method according to claim 1, wherein said removing said conductive film using a chemical mechanical polishing method is performed until a top surface of said insulating film is completely exposed, to complete a wiring line.

21. The method according to claim 5, wherein said removing said first and second conductive films using a chemical mechanical polishing method is performed until a top surface of said insulating film is completely exposed, to complete a wiring line.

22. The method according to claim 9, further comprising:

removing said conductive film using a chemical mechanical polishing method is performed until a top surface of said lower insulating film is completely exposed.

23. The method according to claim 13, further comprising:

removing said conductive film using a chemical mechanical polishing method is performed until a top surface of said lower insulating film is completely exposed.

* * * * *